United States Patent [19]

Turner et al.

[11] Patent Number: 5,457,330

[45] Date of Patent: Oct. 10, 1995

[54] TIN AND/OR LEAD CONTACTS TO P-TYPE HGCDTE

[75] Inventors: Arthur M. Turner, Allen; Arturo Simmons, Anna, both of Tex.

[73] Assignee: Texas Instruments Incorporated, Dallas, Tex.

[21] Appl. No.: 28,090

[22] Filed: Mar. 3, 1993

Related U.S. Application Data

[62] Division of Ser. No. 813,249, Dec. 23, 1991, Pat. No. 5,229,324.

[51] Int. Cl.$^6$ .................... H01L 23/48; H01L 29/46; H01L 29/62; H01L 29/64
[52] U.S. Cl. .................... 257/188; 257/200; 257/741; 257/735
[58] Field of Search .................... 257/772, 188, 257/741, 200, 201, 735; 437/185, 196

[56] References Cited

U.S. PATENT DOCUMENTS

| | | | |
|---|---|---|---|
| 3,636,617 | 1/1972 | Schmidt et al. | 437/147 |
| 4,286,278 | 8/1981 | Lorenze, Jr. et al. | 357/30 |
| 4,377,904 | 3/1983 | Chapman et al. | 29/578 |
| 4,456,630 | 6/1984 | Basol | 427/88 |
| 4,468,685 | 8/1984 | Farrow et al. | 257/188 |
| 4,766,084 | 8/1988 | Bory et al. | 437/3 |
| 4,784,973 | 11/1988 | Stevens et al. | 437/200 |
| 5,229,324 | 7/1993 | Turner et al. | 437/185 |

OTHER PUBLICATIONS

Storm, et al.; "Depth Profile Analysis of Pt, Cu and Au Overlayers on P-Hg$_{1-x}$Cd$_x$Te", *J. Vac. Sci. Technol.*, pp. 14–20, No. 1, Jan./Feb. 1991.

Tregilgas, et al.; "Type Conversion of (Hg,Cd)Te Induced by the Redistribution of Residual Acceptor Impurities", *J. Vac. Sci. Technol.*, pp. 150–152, A 3(1), Jan./Feb. 1985.

Thompson, et al.; "The Growth of CdHgTe By Metalorganic Chemical Vapor Deposition For Optical Communicaiton Devices", *Journal of Crystal Growth*, pp. 917–923, 1988.

Zozime, et al.; "Properties of Sputtered Mercury Telluride Contacts on P-Type Cadmium Telluride", *Revue Phys. Appl.*, pp. 1825–1835, 1988.

Beck, et al.; "Resistance and 1/f Noise of Au, Al, and Ge Contacts to (Hg,Cd)Te", *J. Appl. Phys.*, pp. 6340–6346, 15 May 1990.

Musa, et al., "Properties of Electroless Gold Contacts on p-Type Cadmium Telluride", *J. Appl. Phys.*, pp. 3260–3268, vol. 54, No. 6, Jun. 1983.

Krishnamurthy, et al.; "Studies of Au Ohmic Contacts to P-Type Hg$_{1-x}$Cd$_x$Te", *MET Workshop*, pp. 1–18.

*Primary Examiner*—Sara W. Crane
*Assistant Examiner*—S. V. Clark
*Attorney, Agent, or Firm*—Brian A. Carlson; James C. Kesterson; Richard L. Donaldson

[57] ABSTRACT

An adhesive ohmic contact made to a p-type semiconductor metal substrate or layer (10) comprises tin. The contact preferably includes a tin film (24) approximately 2000 Å in thickness. The p-type semiconductor compound contains mercury, and, while described in conjunction with Hg$_{1-x}$Cd$_x$Te, other elements exhibiting group II and group VI chemical behavior and properties may be used. A cap layer (30) is deposited over film (24), followed by insulating layer 32. Via (34) is then formed and, to complete contact (50), a metal (36) is deposited inside via (34).

21 Claims, 2 Drawing Sheets

TIN AND/OR LEAD CONTACTS TO P-TYPE HGCDTE

This is a division, of application Ser. No. 07/813,249, filed Dec. 23, 1991, now U.S. Pat. No. 5,229,324.

TECHNICAL FIELD OF THE INVENTION

The present invention relates to electronic semiconductor devices, and more particularly, to an adhesive ohmic contact used in conjunction with a p-type semiconductor material containing mercury.

BACKGROUND OF THE INVENTION

In order to effectively build circuits on p-type $Hg_{1-x}Cd_xTe$, electrical contacts to the substrate must be established. Ohmic contacts to p-type $Hg_{1-x}Cd_xTe$ have proven difficult because most common contacting processes either convert the semiconductor to n-type, thereby creating a p-n junction diode in the p-type material or result in a Schottky diode. Ohmic contacts to p-type $Hg_{1-x}Cd_xTe$ have typically been made by the deposition of gold using either electroless plating in a gold solution or by thermal evaporation. These contacts prove less than durable. Attempts have also been made to use copper, platinum, germanium, aluminum, titanium, HgTe and small-bandgap $Hg_{1-x}Cd_xTe$.

While contacts using gold as the contact metal (particularly electroless gold) can be ohmic and of low resistance, they suffer from a mechanically weak gold to $Hg_{1-x}Cd_xTe$ interface, which causes poor adhesion of gold film. These films often delaminate during the processing that is required to build a multilayer integrated circuit. Even if gross delamination does not occur, these gold contacts are plagued by non-reproducible contact resistances which may also result from a lack of integrity at the gold to $Hg_{1-x}Cd_xTe$ interface. Platinum, germanium, aluminum and titanium produce rectifying and therefore highly resistive contacts. Copper is an acceptor in $Hg_{1-x}Cd_xTe$ and is known to diffuse quickly at room temperature. Even small amounts of copper in contact with $Hg_{1-x}Cd_xTe$ have the potential to raise the acceptor concentration of the entire slice to levels which will dramatically degrade Metal Insulator Semiconductor (MIS) performance.

High quality films of small-bandgap $Hg_{1-x}Cd_xTe$ and HgTe grown by molecular beam epitaxy (MBE) or metal organic chemical vapor deposition (MOCVD) have been shown
to produce ohmic contacts to p-type $Hg_{1-x}Cd_xTe$, but require expensive and complex deposition equipment and deposition temperatures which are problematically high compared to $Hg_{1-x}Cd_xTe$ processing temperatures. Selective area deposition by MBE or MOCVD on $Hg_{1-x}Cd_xTe$ is difficult if not impossible.

HgTe contacts formed using thermal evaporation of HgTe onto a 5° C. substrate requires considerable thermal annealing to become ohmic and does not achieve specific contact resistances as low as tin contacts.

A long felt need therefore continues to exist for an improved contact to a p-type semiconductor material containing mercury.

SUMMARY OF THE INVENTION

According to the invention, an adhesive ohmic contact is made to a p-type semiconductor material that contains mercury, and includes elements exhibiting the chemical behavior and properties of group II elements and group VI elements. The contact contains tin.

The contact may be prepared by depositing a passivation layer upon a face of the p-type semiconductor material that contains mercury. A photoresist layer is formed over the passivation layer. The photoresist layer is patterned and a wet etch such as HCl forms an anisotropic via through the passivation layer to the face of the semiconductor material. This wet etch is followed by a 5% nitric acid dip to clean the surface of the semiconductor material of any residual oxide.

Tin is then deposited on the exposed surface of the semiconductor material followed by deposit of a cap containing $TiO_xN_y$. Next, the metal and photoresist not protected by the cap are lifted and an insulating layer is formed on all top and exterior lateral surfaces. The insulating layer is then etched to the tin film to form a via having exterior lateral margins. Finally, a metal is inserted to form a contact buss to the diode contact.

Somewhat desirable results have also been obtained by a similar process which replaced the HCl etch and nitric acid dip with a 1/8% bromine in methanol solution wet etch followed by a sulfuric acid dip. Additionally, lead may be substituted for tin in the present invention.

An integrated circuit is formed on a semiconductor substrate of semiconductor material containing mercury and containing a plurality of p-type areas formed on the semiconductor material. Each p-type area has a conductive ohmic adhesive contact.

The technical advantages of the present invention include the following:

1. The equipment required to produce tin contacts to p-type $Hg_{1-x}Cd_xTe$ is relatively simple and inexpensive when compared to MBE or MOCVD reactors.

2. The process is compatible with $Hg_{1-x}Cd_xTe$ device processing temperatures and allows selected area deposition using standard photolithographic techniques.

3. The contacts are ohmic after a low temperature anneal but are stable up to at least 150° C.

4. Adhesion of the tin to the $Hg_{1-x}Cd_xTe$ and of tin to ZnS (the gate dielectric for MIS devices) and of ZnS to tin is excellent.

5. Tin is also a good ohmic contact to ion implanted $Hg_{1-x}Cd_xTe$ which allows a single tin film to serve both as a substrate contact and n on p diode contact.

An important aspect of this invention is that the capacitance of MIS devices with tin substrate contacts is virtually independent of frequency which indicates excellent substrate contact. The capacitance varies by no more than 1.5% from 4 kHz to 1 MHz.

BRIEF DESCRIPTION OF THE DRAWINGS

Other aspects of the invention and their advantages will be discerned when one refers to the following detailed description as taken in conjunction with the drawings, in which.

DETAILED DESCRIPTION OF THE INVENTION

The preferred embodiment of the present invention is best understood by referring to FIGS. 1 through 9 of the drawings, like numerals being used for like and corresponding parts of the various drawings.

Figure 1:
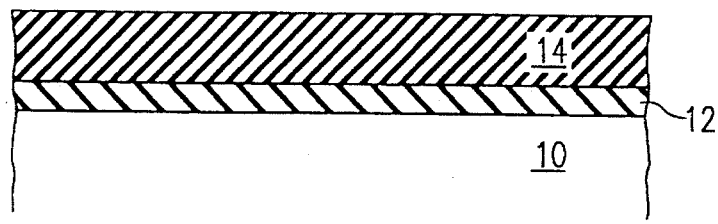
FIGS. 1, 2, 3, 4, 5 and 6 are greatly enlarged schematic elevational sectional views of a p-type $Hg_{1-x}Cd_xTe$ semiconductor layer showing progressive stages in the fabrication of an adhesive ohmic contact according to the invention.
Figure 2:
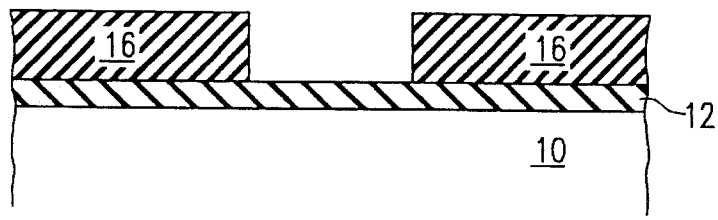

FIGS. 1 through 6 are greatly enlarged schematic elevational sectional views of progressive stages a fabrication process according to of the invention. Referring first to FIG. 1, a p-type semiconductor material substrate or layer 10 containing mercury is provided, such as $Hg_{1-x}Cd_xTe$. While the invention is described in conjunction with $Hg_{1-x}Cd_xTe$ semiconductors, it has application to any ternary or quaternary semiconductor containing mercury. For example, other semiconductor compounds containing mercury may be used, such as $Hg_{1-x}Zn_xTe$, $Hg_{1-x}Cd_xSe$ and $Hg_{1-x}Zn_xSe$. Additionally, elements exhibiting group II or group VI chemical behavior and properties may be used. For example, manganese, which possesses chemical properties similar to group II elements, may be substituted for cadmium, yielding $Hg_{1-x}Mn_xTe$ and $Hg_{1-x}Mn_xSe$. Further, the mercury value in these compounds may vary stoichiometrically from near zero to near one. For infrared sensor applications, mercury x values will range from 0.3 to 0.4. A passivation layer 12 is deposited over layer 10 by any well known means approximately 2000 Å thick. The passivation layer may be zinc sulfide, cadmium telluride, silicon nitride or another layer known in the literature to be suitable for passivating $Hg_{1-x}Cd_xTe$. A photoresist layer 14 is then deposited over the passivation layer 12. Xylene or another photoresist solvent is selectively applied to photoresist layer 14 to form photoresist pattern 16 shown in FIG. 2.

Figure 3:
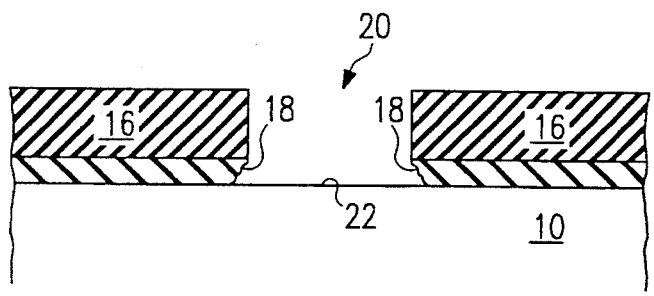

Turning next to FIG. 3, the photoresist patterning is followed by an HCl (50% to 75% concentration depending on the thickness of the passivation layer 12) wet etch to remove the zinc sulfide. The HCl etch is isotropic, leaving sides 18 of via 20 very rough with some undercut. The HCl etch is water rinsed and then followed immediately by a 5% nitric acid cleaning (nitric dip) of the surface 22 to remove any residual oxide from the surface 22. This cleaning step is important to assure continuity of the tin film deposited thereafter. Evaporated tin on $Hg_{1-x}Cd_xTe$ which has had the native oxide stripped with nitric or lactic acid forms a smooth specular film.

Figure 4:
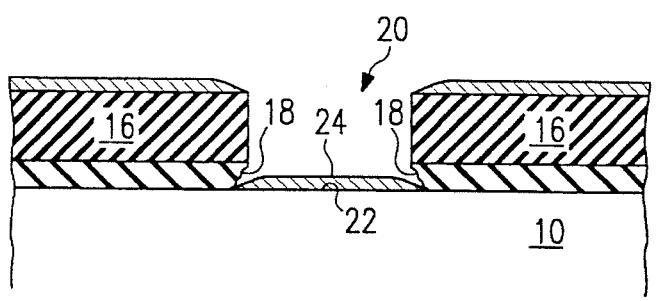

FIG. 4 depicts the deposit of a tin film 24 of approximately 2000 Å thick to form an ohmic contact on the surface 22. Additionally, metal film is also deposited (not shown) on surface 26 of the photoresist pattern 16. Sputtered or evaporated tin may be successfully used for the metal film 24. The tin will nucleate preferentially on the exposed surface of HgCdTe layer 10 and will not adhere to the sidewalls of zinc sulfide layer 12. Lead and mixtures of tin and lead may also be used for metal film 24.

Figure 5:
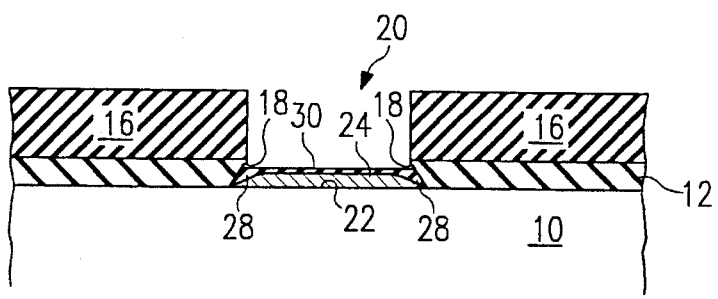

Referring next to FIG. 5, it will sometimes happen that a gap 28 will appear between the sidewall of the zinc sulfide layer 18 and the surface 29 of the tin contact 24, exposing areas of the semiconductor 10. In order to minimize any problem gap 28, a cap layer 30 is applied over metal film 24. The cap layer could comprise $TiO_xN_y$. The value of x and y may range stoichiometrically from 0.1 to 0.4, and from 0.9 to 0.6, respectively. Preferably x is approximately 0.3 and y is approximately 0.7. Next, photoresist layer 14 and the tin deposited thereon is lifted, leaving metal film 24 as capped by cap layer 30.

Figure 6:
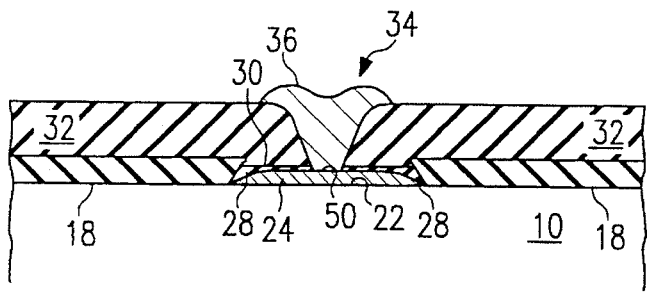

FIG. 6 illustrates the next step of depositing another zinc sulfide insulating layer 32 followed by defining and forming a via 34 having sidewalls spaced interiorly from any gap 28. Finally, to make a contact 50, a metal 36 is deposited inside via 34. The metal 36 could comprise indium or an In/Pb alloy.

A similar process may also be used which substitutes, for the HCl wet etch, a wet etch of the zinc sulfide using a 1/8% bromine in methanol solution, followed by a sulfuric acid etch. A tin film having thickness of approximately 2000 Å is then precipitated from evaporated tin onto the $Hg_{1-x}Cd_xTe$ surface to complete the contact.

According to the invention, these contacts are ohmic with a 77K specific contact resistance of 0.02 ohm-cm or less after an overnight anneal at 100° C.

EXAMPLE I

Tin contacts are suitable as low-resistance, low-noise, reliable and manufacturable ohmic contacts to p-type $Hg_{1-x}Cd_xTe$. A transmission line test structure was formed which had five 5×40 mil lines separated by 1, 2, 3 and 4 mils. Except where noted, the $Hg_{1-x}Cd_xTe$ used in these experiments was grown by LPE and had a five micron cutoff wavelength and carrier concentrations in the mid $10^{14}$ to mid $10^{15}$ cm$^{-3}$. The surface of the $Hg_{1-x}Cd_xTe$ was passivated and blanket coated with a ZnS dielectric which produced a positive flatband condition and thus controlled surface currents. Vias for transmission lines were then opened in the ZnS using a photoresist mask and sulfuric acid etch. The exposed $Hg_{1-x}Cd_xTe$ surface then got various treatments followed by the deposition of the contact material being investigated. $Hg_{1-x}Cd_xTe$ surface treatments included, but were not limited to: 1/16% bromine in methanol etch; oxygen plasma ash; oxygen plasma ash followed by a nitric or lactic acid etch; vacuum anneal, air anneal and combinations of the above.

The contact materials investigated included but were not limited to: electroless gold, evaporated gold, evaporated HgTe, evaporated tellurium and evaporated tin. Bond metal was then deposited over the contact material and the devices were tested by measuring the 77K current versus voltage curves by the four point probe method.

The electroless gold contacts which survived processing were rectifying and highly resistive as processed. After annealing at 100° C. overnight, and at 120° C. for one hour, the gold contacts became ohmic with 77K specific contact resistances between 1 and 0.01 ohm-cm$^2$. However, the electroless gold to $Hg_{1-x}Cd_xTe$ bond was shown to be a weak one and many of these devices did not survive processing.

This is consistent with the adhesion problems and non-reproducibility of the electroless gold contacts currently used for substrate contacts to p-type $Hg_{1-x}Cd_xTe$ devices.

Figure 7:
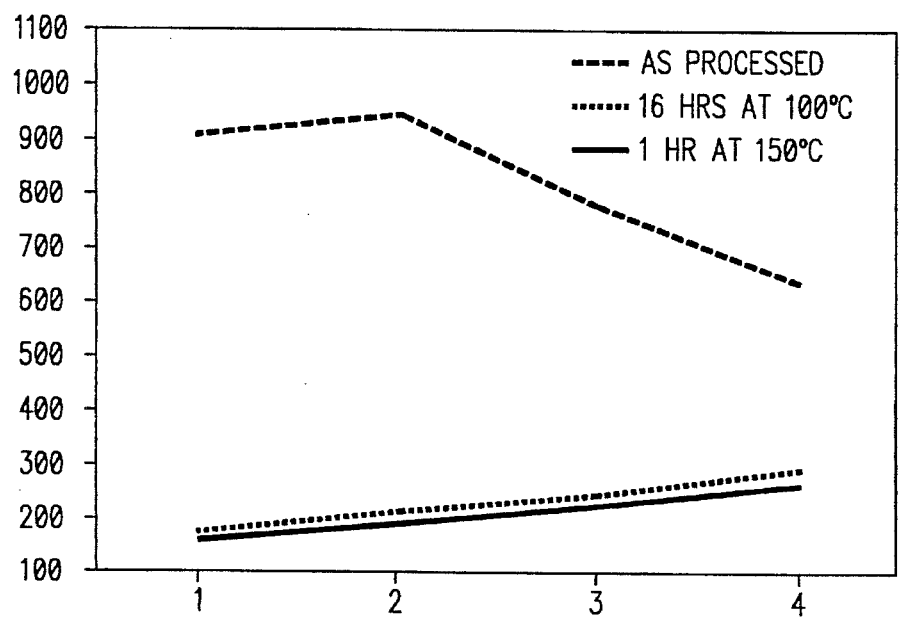
FIG. 7 is a chart depicting the measured resistance as a function of transmission line spacing for tin contacts on five micron, p-type $Hg_{1-x}Cd_xTe$.
Figure 8:
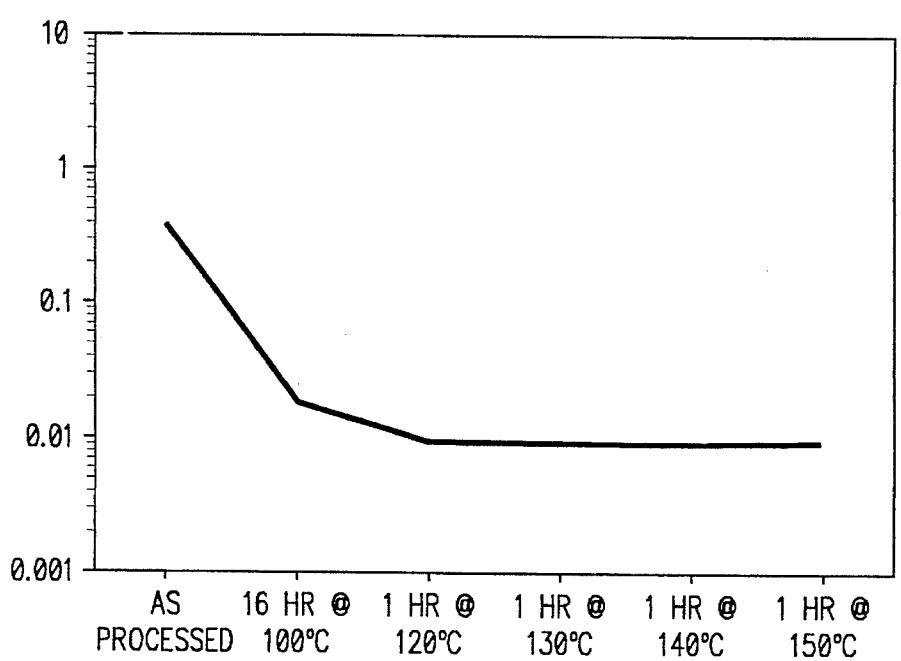
FIG. 8 is a chart depicting the specific contact resistance of tin contacts to five micron, p-type HgCdTe as a function of anneal conditions.

The HgTe contacts were rectifying and highly resistive as processed as well as after extended 100° C. bakes. After annealing at 140° C. for one hour the HgTe contacts became ohmic with 77K specific contact resistances between 0.5 and 0.01 ohm-cm$^2$. No adhesion problems were experienced with the HgTe contacts. Tin contacts were ohmic as processed or became ohmic with 77K specific contact resistances of 0.02 ohm-cm$^2$ or less after an overnight bake at 100° C. FIG. 7 shows the measured resistance as a function of line separation for tin contacts on 5 micron p-type $Hg_{1-x}Cd_xTe$. ("5-micron" being indicative of the approximate wavelength to which the device will be sensitive.) The specific contact resistance of these tin contacts as a function of bake temperature is shown in FIG. 8. Tin contacts on 10 micron p-type $Hg_{1-x}Cd_xTe$ with carrier concentrations in the mid $10^{14}$ cm$^{-3}$ were shown to have specific contact resistance of 0.01 ohm-cm or less at 77K.

EXAMPLE II

Tin contacts were deposited on actual MIS devices built on 5 micron p-type $Hg_{1-x}Cd_xTe$ with carrier concentrations in the mid $10^{14}$ cm$^{-3}$. The capacitance of these devices was virtually independent of frequency which indicates excellent substrate contact. The capacitance varies by no more than 1.5% from 4 kHz to 1 MHz.

Figure 9:
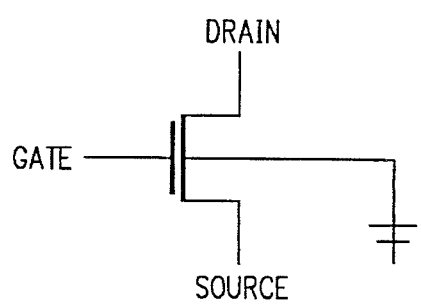
FIG. 9 is a schematic functional block diagram of a transistor for which the invention may be used.

FIG. 9 depicts a transistor formed on p-type material with n-type source and drain regions, wherein the p-tank is connected to ground using an adhesive ohmic contact according to the invention.

According to this invention, the use of tin as a contact metal on p-type $Hg_{1-x}Cd_xTe$ is applicable to the entire range of x. For x values larger than 0.5, ohmic contacts to p-type material are a problem even at a temperature of 300° K. Tin should be an effective contact material for these short wavelength systems as well as for the 5 micron and larger wavelength systems.

While the preferred embodiment of the invention and their advantages have been set forth in the above detailed description, the invention is not limited thereto but only by the scope and spirit of the appended claims.

What is claimed is:

1. An adhesive ohmic tin contact made to a p-type area of a semiconductor material containing mercury also including elements exhibiting behavior of group II elements and group VI elements.

2. The contact of claim 1, wherein said p-type semiconductor material has the formula $Hg_{1-x}A_xB$, wherein A is an element exhibiting the chemical behavior and properties of group II elements, including cadmium, zinc and manganese, and B is an element exhibiting chemical behavior and properties of group VI elements, including tellurium and selenium, wherein x is any real number selected from near zero to near one.

3. The contact of claim 1, wherein said p-type semiconductor material comprising mercury is $Hg_xCd_{1-x}Te$, wherein x is any real number selected from near zero to near one.

4. The contact of claim 1, wherein said p-type semiconductor material comprises mercury in stoichiometric concentrations of 0.3 to 0.4.

5. An ohmic contact made to a p-type area of a semiconductor material containing mercury, wherein said contact comprises tin.

6. An ohmic contact made to a p-type semiconductor material containing mercury, wherein said contact comprises lead.

7. An integrated circuit formed on a semiconductor substrate of semiconductor material and containing mercury, comprising:

a plurality of p-type areas formed at a face of said semiconductor material; and a plurality of conductive ohmic adhesive contacts made to respective ones of said p-type areas, wherein said contacts are selected from the group consisting of tin, lead, and mixtures thereof.

8. The integrated circuit of claim 7, wherein the plurality of p-type areas form an image array of p-type and n-type junction diodes.

9. An adhesive ohmic contact to a p-type intrinsic semiconductor material containing mercury, comprising:

a layer of p-type intrinsic semiconductor material containing mercury and having a p-type area;

a passivating layer formed on the p-type area;

a via opened in the passivating layer to the p-type area; and a nonrectifying metallic contact formed in the via to adhere to the p-type area, wherein said nonrectifying metallic contact is selected from the group consisting of tin, lead, and mixtures thereof.

10. The contact of claim 9, wherein said nonrectifying metallic contact is approximately 2000 Å in thickness.

11. The contact of claim 9, wherein said semiconductor material comprises elements exhibiting the chemical behavior and properties of group II elements and elements exhibiting the chemical behavior and properties of group VI elements.

12. The contact of claim 11, wherein said semiconductor has a formula $Hg_xA_{1-x}B$, wherein A is selected from the group consisting of cadmium, zinc and manganese and B is selected from the group consisting of tellurium and selenium, wherein x is a real number in the range of near one to near zero.

13. The contact of claim 9, wherein said passivating layer is zinc sulfide.

14. The contact of claim 9, wherein said via has sidewalls and said nonrectifying metallic contact has an exterior surface opposed to said face, the exterior surface having a lateral peripheral margin on the face, a cap layer deposited in said via to cover said exterior surface and to cover any gap between said lateral peripheral margin and said sidewalls of said via, such that said face of said semiconductor is sealed; and a second passivating layer deposited in said via and over said cap layer, a second via formed within said via and having sidewalls disposed laterally inwardly of the sidewalls of said via, said via formed to expose an area of said exterior surface of said contact within said lateral peripheral margin thereof.

15. The contact of claim 14, wherein said cap layer is $TiO_xN_y$, x being a real number in the range of 0.1 to 0.4, y being a real number in the range of 0.9 to 0.6.

16. The contact of claim 14, wherein said second passivating layer is zinc sulfide.

17. The contact of claim 5, wherein said contact further comprises lead.

18. An adhesive ohmic lead contact made to a p-type area of a semiconductor material containing mercury also including elements exhibiting behavior of group II elements and group VI elements.

19. The contact of claim 18, wherein said p-type semiconductor material has the formula $Hg_{1-x}A_xB$, wherein A is an element exhibiting the chemical behavior and properties of group II elements, including cadmium, zinc and manganese, and B is an element exhibiting chemical behavior and properties of group VI elements, including tellurium and selenium, wherein x is any real number selected from near zero to near one.

20. The contact of claim 18, wherein said p-type semiconductor material comprising mercury is $Hg_xCd_{1-x}Te$, wherein x is any real number selected from near zero to near one.

21. The contact of claim 18, wherein said p-type semiconductor material comprises mercury in stoichiometric concentrations of 0.3 to 0.4.

* * * * *